United States Patent
Jiang et al.

(10) Patent No.: US 10,247,591 B2
(45) Date of Patent: Apr. 2, 2019

(54) EXPERIMENTAL DEVICE FOR DEBRIS FLOW SIMULATION

(71) Applicant: Institute of Mountain Hazards and Environment, Chinese Academy of Sciences, Chengdu (CN)

(72) Inventors: Yuanjun Jiang, Chengdu (CN); Siyou Xiao, Xiangtan (CN); Yue Song, Chengde (CN); Zhen Jiang, Chengdu (CN); Meng Wang, Chengdu (CN)

(73) Assignee: INSTITUTE OF MOUNTAIN HAZARDS AND ENVIRONMENT, CHINESE ACADEMY OF SCIENCES, Chengdu (CN)

( * ) Notice: Subject to any disclaimer, the term of this patent is extended or adjusted under 35 U.S.C. 154(b) by 58 days.

(21) Appl. No.: 15/708,109

(22) Filed: Sep. 18, 2017

(65) Prior Publication Data
US 2018/0087945 A1 Mar. 29, 2018

(30) Foreign Application Priority Data
Sep. 28, 2016 (CN) .......................... 2016 1 0857260

(51) Int. Cl.
| | |
|---|---|
| *G01F 1/704* | (2006.01) |
| *G06F 17/50* | (2006.01) |
| *H04N 5/247* | (2006.01) |
| *G01L 5/00* | (2006.01) |

(52) U.S. Cl.
CPC ............ *G01F 1/704* (2013.01); *G01L 5/0052* (2013.01); *G06F 17/5009* (2013.01); *H04N 5/247* (2013.01)

(58) Field of Classification Search
None
See application file for complete search history.

(56) References Cited

U.S. PATENT DOCUMENTS

2014/0009621 A1* 1/2014 Tucker ............... G01N 15/0227
348/159

* cited by examiner

*Primary Examiner* — Christopher G Findley
(74) *Attorney, Agent, or Firm* — Gokalp Bayramoglu

(57) ABSTRACT

A new experimental device for debris flow simulation, including a material supply device, a flow channel, a stacking groove, a pole, a first high-speed camera, a second high-speed camera, a fixing frame, and a sliding rail. The material supply device is used to release the debris flow simulation material to the flow channel, to realize the start of the debris flow simulation. The stacking groove is used for the accumulation of the debris flow. The pole is used to support the stacking groove and adjust the slope of the stacking groove. The fixing frame is used to fix the first high-speed camera. The second high-speed camera can monitor the movement of the debris flow. The invention can flexibly simulate the movement characteristics of various debris flow and obtain the test data, so as to provide data support for the subsequent study.

14 Claims, 3 Drawing Sheets

EXPERIMENTAL DEVICE FOR DEBRIS FLOW SIMULATION

CROSS REFERENCE TO RELATED APPLICATIONS

This application is based upon and claims priority to Chinese Patent Application No. 201610857260.X, filed on Sep. 28, 2016, the entire contents of which are incorporated herein by reference.

TECHNICAL FIELD

The present invention relates to an experimental device, particularly to a new experimental device for debris flow simulation.

BACKGROUND

The existing experimental system for stimulating the debris flow movement and accumulation process is to simulate the moving characteristics of the debris flow mainly through the stacking area bracket, the transition bracket, the sliding track bracket, the stacking area experimental groove, and the sliding track experimental groove. Next, the fixed high-speed camera is used to monitor the movement and accumulation process of the debris flow.

The existing experimental device has the following technical deficiencies:

(1) The existing experimental device failed to simulate the whole process of movement and accumulation of the debris flow. As the debris flow is activated, the debris flow particles are affected by the air. After being accelerated in the short-range phase, the particles of the debris flow are accumulated through multiple channels. Thus, when a single siding channel is used to simulate the debris flow, the following conditions cannot be fully stimulated, i.e., the movement of the debris flow in the short-range acceleration phase with different angles and different gradients and the accumulation process after the acceleration.

(2) The existing experimental device cannot monitor the whole process of the movement and accumulation of the debris flow. During the movement of the debris flow, since the particles with different sizes will be sorted, the sorted results directly affect the impact force of the debris flow on the protective structure. Therefore, during experimental monitoring, it is difficult for the fixed high-speed camera to accurately capture the motion trajectory and velocity of the particles when the debris flow is sorted. Moreover, in terms of the arrangement manner of the high-speed camera, since the impact of the debris flow is a continuous impact process with a certain duration, it is necessary to measure the movement velocity of the particles at different measuring points and different time points during the impact of the debris flow, such that the movement characteristics of the debris flow can be accurately reflected. However, the arrangement manner of the traditional high-speed camera can only reflect the movement characteristics of partial debris flow.

(3) The structure of the existing experimental device is not flexible. The experiment is inefficient. Since the conventional experimental equipment of the debris flow cannot adjust the slope and width of the sliding groove, it can only simulate the movement characteristics of the debris flow of different materials, but cannot simulate the influence of different channels on the movement characteristics of the debris flow.

In summary, it is necessary to improve the existing simulation experimental system of the movement and accumulation process of the debris flow.

SUMMARY OF THE INVENTION

As to the deficiencies of the prior, the present invention provides a new experimental device for debris flow simulation, which is flexible and can accurately simulate the movement characteristics of various debris flow in various channels with different width, and obtain corresponding testing data.

In order to realize the above objectives, technical solutions used by the present invention are as below:

A new experimental device for debris flow simulation, including a material supply device, a flow channel, a stacking groove, a pole, a first high-speed camera, a second high-speed camera, a fixing frame and a sliding rail.

The material supply device is configured to store the debris flow simulation material and release the debris flow simulation material to the flow channel, so as to realize a start of the debris flow simulation.

The flow channel is provided in a slant manner and configured to introduce debris flow simulation material towards a direction of the stacking groove. A position of a side surface of the flow channel is adjustable to change an overall width of the flow channel.

One end of the stacking groove is connected to the flow channel for an accumulation of the debris flow. A plurality of fixing holes are provided inside the stacking groove. The plurality of fixing holes can be arranged in the stacking groove at equal intervals. A protective structure of the debris flow is mounted inside the fixing holes. The debris flow protective structure is configured to simulate the impact of the debris flow on the protective structure. The protective structure can be a debris flow retaining wall, a flexible net column, etc. The protective structure of the debris flow is installed by providing the fixing holes, such that the experimental efficiency is improved. At the same time, the position of the side surface of the stacking groove is adjustable to change the overall width of the stacking groove;

The pole, is provided at the other end of the stacking groove and is used to support the stacking groove and adjust the slope of the stacking groove.

The number of the fixing frames is at least three, and the fixing frames are arranged side-by-side right above the flow channel to fix the first high-speed camera, so that the first high-speed camera monitors the movement of the debris flow at the different positions and angles above the flow channel.

The sliding rail is arranged beside the flow channel and parallel to the flow channel. The second high-speed camera is provided on the sliding rail and is movable along the sliding rail to monitor the movement of the debris flow in the flow channel from the side.

Specifically, the material supply device includes a material box provided in a slant manner and connected to the flow channel to store the debris flow simulation material, a baffle provided at a joint position of the material box and the flow channel, and a pulling rope connected to the baffle to control the opening and closing of the baffle so as to control whether the material of the debris flow simulation passes through the flow channel or not.

Further, the present invention also includes a support frame, wherein the material box is fixed on the support frame.

Further, the present invention also includes a fixed base provided in the support frame and a hydraulic lifting column used configured to adjust the inclination angle of the flow channel. One end of the hydraulic lifting column is connected to the fixed base, and the other end of the hydraulic lifting column is connected to the flow channel. The flow channel can simulate movement characteristics of the debris flow at different angles by controlling the inclination angle of the flow channel through the hydraulic lifting column.

Further, the present invention also includes a dial provided between the flow channel and the stacking groove, and an angle indicating line provided on the flow channel and connected to the dial for indicating a scale. The dial is configured to measure the inclination angle of the flow channel. The dial and the angle indicating line can accurately measure the inclination angle of the flow channel, so that the situation of the movement of the debris flow and the material accumulation can be recorded easily. Therefore, the experimental simulation condition can be determined precisely. Hence, a good fundamental condition can be established for the research of the movement characteristics of the debris flow.

The flow channel is further provided with an erosion groove and a cover plate of the erosion groove to simulate a debris flow erosion experiment. The cover plate of the erosion groove flushes with a bottom of the flow channel. The cover plate of the erosion groove covers the erosion groove through a fixing groove of the cover plate which is provided in the erosion groove. The provision of erosion groove and the cover plate of the erosion groove, makes it easy to perform the erosion experiment. Therefore, the amplification effect of the erosion of the debris flow can be researched.

The cover plate of the erosion groove is further provided with a plurality of reserved holes. Each reserved hole is provided with a pressure sensor to measure the dynamic pressure on the substrate during the movement of the debris flow. The provided pressure sensor can monitor the dynamic pressure on the substrate during the flow of the debris. The magnitude of the punching force and shear force during the movement of the debris can be measured, such that the movement characteristics of the debris flow can be studied more accurately.

Further, the cover plate of the erosion groove is provided with three rows of reserved holes. The middle row of the reserved holes is provided on the central axis of the cover plate of the erosion groove, so as to measure the dynamic pressure of the substrate during the movement of the debris fully and accurately.

Further, the present invention also includes at least one screw hole of the cover plate. The screw hole of the cover plate is provided at the corners of the cover plate of the erosion groove. When an erosion experiment is to be carried out, the cap bolt is inserted into the screw hole of the cover plate such that the cover plate of the erosion groove can be taken out. Next, the erosion groove is filled with the erosion material.

Further, there are four screw holes in the cover plate, wherein the screw holes of the cover plate are provided at four corners of the cover plate of the erosion groove, so that the cover plate of the erosion groove can be taken out easily and rapidly.

To ensure the proper sealing between the stacking groove and the flow channel, the stacking groove and the flow channel are sealed with a flexible continuous material.

Compared with the prior art, the invention has the following advantages:

(1) The present invention has a reasonable structure and intelligent design. The design has the adjustable sides of the flow channel and the stacking groove, together with the fixed frame, the sliding rail, and the two high-speed cameras. When the debris flow simulation material prepared in advance is poured into the material box, the material box baffle is used to control the start time and the start flow of the debris flow. Then, the high-speed cameras are moved, and the overall widths of the stacking groove and the flow channel are adjusted. Thus, the debris flow simulation and data testing are realized. The present invention handles the problems of previous experimental device, such as a limited height, gradient, and inclination angle due to the structure. The flow channel and the stacking groove are used to simulate the movement characteristics of the debris flow in the two-level channels with different slopes. The positions of side surfaces of the stacking groove and the flow channel can be adjusted to control the widths of the flow channel and the stacking groove, so as to flexibly simulate the flow patterns and movement characteristics of the various debris flow in the channels with different widths. Also, corresponding testing data (moving speed) at different positions, angles, and time points in the particle moving direction are obtained.

(2) The present invention optimizes the experimental device structure and improves the experimental efficiency. In the present invention, a pole is provided at the end of the stacking groove to support the stacking groove. The slope of the stacking groove can be adjusted. At the same time, the debris flow retaining wall with different structures is provided in the stacking groove. The impact of debris flow on different retaining walls can be simulated. That is, the present invention can measure moving speed of various debris flows in the flow channels with different width. Also, the impact of various debris flows on different structural retaining walls can be obtained. Thus, the parameters support can be provided to the subsequent study of movement characteristics of the debris flow in the channel.

(3) In the present invention, the inclination angle of the flow channel can be adjusted by the hydraulic lifting column. The movement state of the debris flow under different movement characteristics can be studied. The accuracy of the simulation experiment of the debris flow can be greatly improved. At the same time, the structure can be used to measure the inclination angle of the flow channel accurately in combination of the dial and the angle indicating line. The experimental simulation conditions can be determined more accurately. Hence, a good fundamental condition can be established for the research of the movement characteristics of the debris flow.

(4) In the present invention, the erosion experiment is easy to be performed since the erosion groove and the cover plate of the erosion groove are provided. Thus, the amplification effect of the erosion of the debris flow can be studied. By arranging pressure sensors on the cover plate of the erosion groove, the dynamic pressure of the substrate is monitored during the movement of the debris flow. The movement characteristics of the debris flow can be studied more accurately by measuring the punching force and shear force during the movement of the debris flow.

(5) The present invention uses the flexible continuous material to seal the stacking groove and the flow channel, which can make the experimental system structure more compact. The sealing and the safety are well ensured.

(6) The experimental equipment of the present invention has the advantages of being removable, compostable, easy operation, versatile functions, repeatable, and low cost. Thus, the present invention is very suitable for popularization and application.

DETAILED DESCRIPTION OF THE EMBODIMENTS

Hereinafter, the present invention will be further described with reference to the accompanying drawings and embodiments. The present invention includes the following embodiments but not limited thereto.

Figure 1:
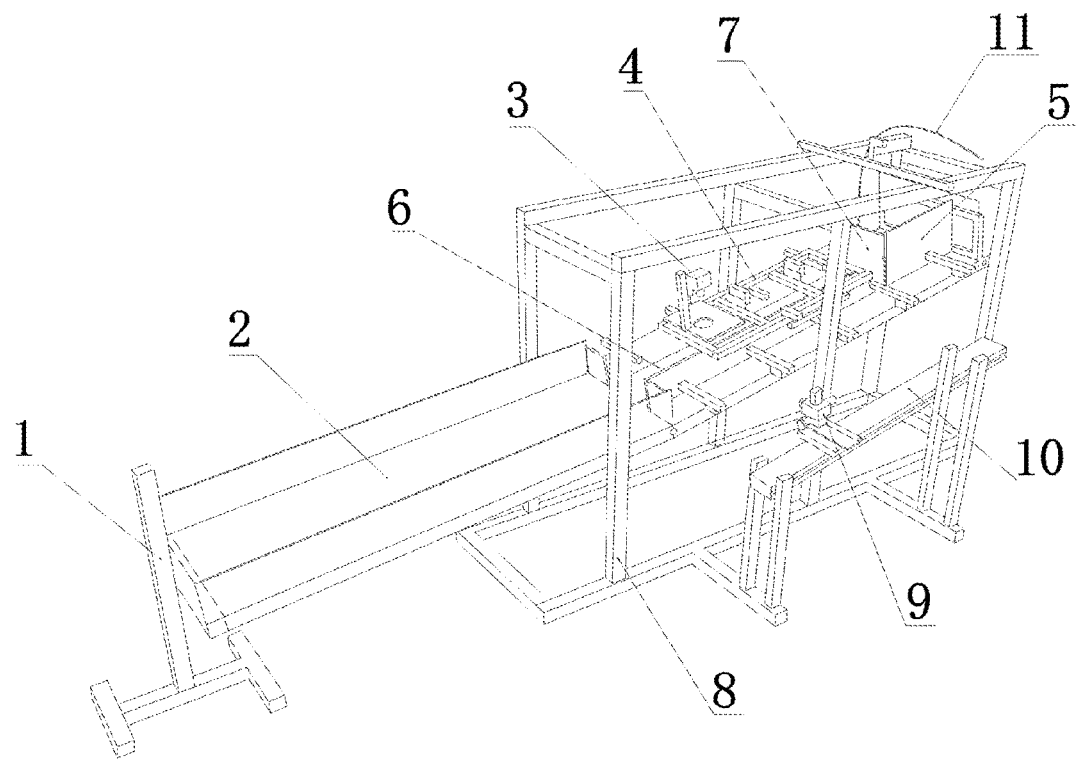
FIG. 1 is a perspective view of the present invention.
Figure 2:
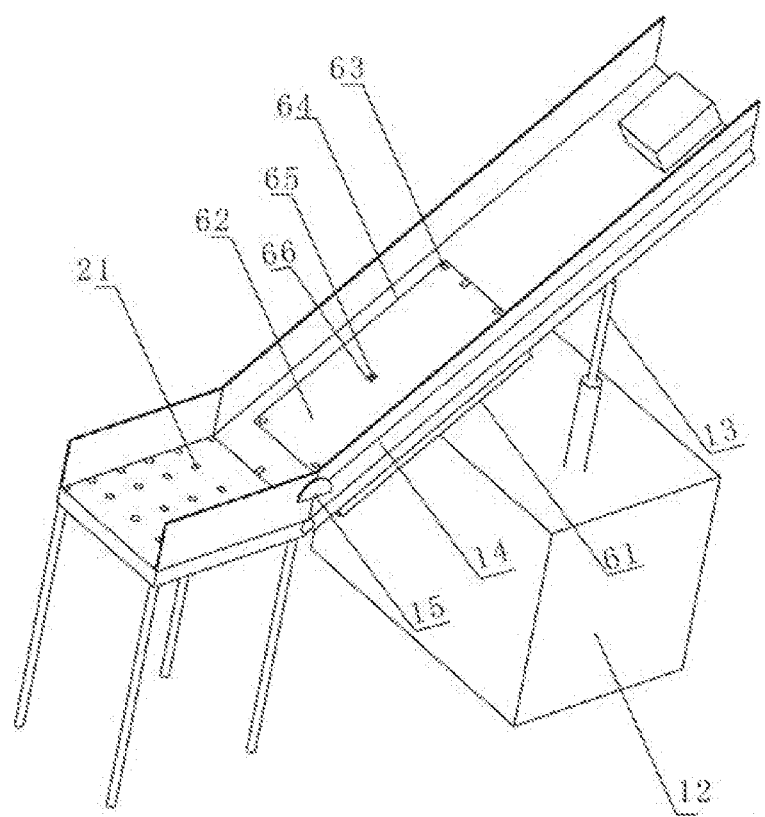
FIG. 2 is a schematic structural view of the present invention.
Figure 3:
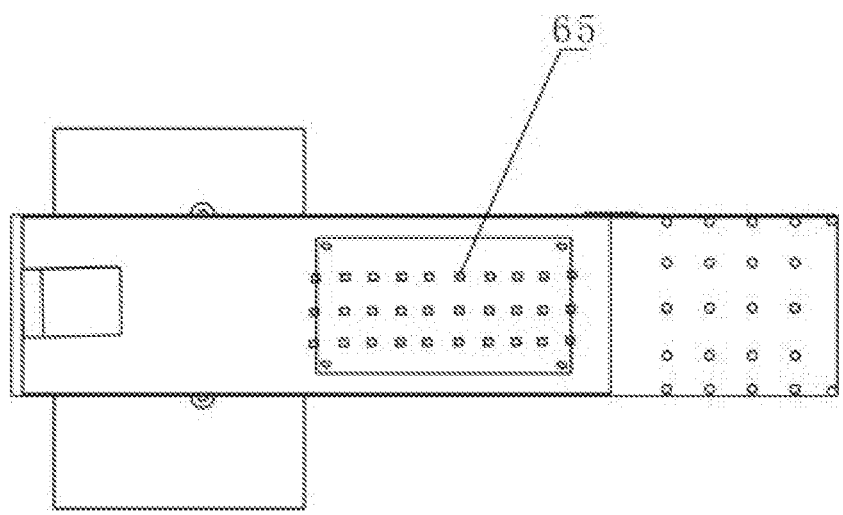
FIG. 3 is a top view of the present invention.
In the drawings, the names corresponding to the reference numbers are listed as below:
1—pole, 2—stacking groove, 21—fixing hole, 3—the first high-speed camera, 4—fixing frame, 5—material box, 6—flow channel, 61—erosion groove, 62—cover plate of the erosion groove, 63—screw hole of the cover plate, 64—fixing groove of the cover plate, 65—pressure sensor, 66—reserved hole, 7—baffle, 8—support frame, 9—the second high-speed camera, 10—sliding rail, 11—pulling rope, 12—fixed base, 13—hydraulic lifting column, 14—angle indicating line, 15—dial.

As shown in FIGS. 1 to 3, the present invention provides an experimental device for debris flow simulation, which includes a material supply device, flow channel 6, stacking groove 2, pole 1, the first high-speed camera 3, the second high-speed camera 9, fixing frame 4, and sliding rail 10.

The material supply device is used to store the debris flow simulation material and release the material into flow channel 6, to realize the start of the debris flow simulation. In the embodiment, the material supply device includes material box 5 which is provided in a slant manner and connected to flow channel 6 to store the debris flow simulation material (material box 5 is fixed support frame 8). The material supply device also includes baffle 7 which is provided at the joint position of material box 5 and flow channel 6. Further, the material supply device includes pulling rope 11 which is connected to baffle 7 to control the opening and closing of the baffle, so as to control whether the debris flow simulation material can pass through the flow channel.

The flow channel is also provided in a slant manner. The flow channel is used to introduce the debris flow simulation material towards the direction of stacking groove 2. The position of the side surface of flow channel 6 is adjustable, such that the overall width of the flow channel can be altered. One end of stacking groove 2 is connected to flow channel 6 to accumulated the debris flow. A plurality of fixing holes 21 are provided inside the stacking groove. The plurality of fixing holes 21 can be arranged inside stacking groove 2 with equal intervals. A protective structure of the debris flow is mounted inside fixing hole 21. The fixing holes can be used as the anchor foundation or pile foundation of the protective structure. The fixing position can be adjusted flexibly based on the requirement of the protective structure model. The protective structure can be a debris flow retaining wall, a flexible net column, etc. The protective structure of the debris flow is installed by providing the fixing holes. The impact of the debris flow on the protective structure can be stimulated. Thus, the experimental efficiency is improved. At the same time, the position of the side surface of stacking groove 2 is adjustable to change the overall width of the stacking groove.

Pole 1 is provided at the other end of stacking groove 2. Pole 1 is used to support stacking groove 2 and adjust the slope of stacking groove 2. There are at least three fixing frames 4. The fixing frames 4 are arranged side-by-side right above flow channel 6 to fix the first high-speed camera 3, so that the first high-speed camera 3 monitors the movement of the debris flow in flow channel 6 at different positions and angles. Sliding rail 10 is arranged beside flow channel 6 and parallel to flow channel 6. The second high-speed camera 9 is provided on sliding rail 10 and is movable along sliding rail 10 to monitor the movement of the debris flow in flow channel 6 from the side.

The experimental device for debris flow simulation also includes support frame 8. Material box 5 is fixed on support frame 8. Further, fixed base 12 is provided inside support frame 8. Hydraulic lifting column 13 is provided on fixed base 12. One end of hydraulic lifting column 13 is connected to fixed base 12. The other end of the hydraulic lifting column is connected to flow channel 6 to adjust the inclination angle of flow channel 6. The inclination angle of flow channel 6 is controlled by hydraulic lifting column 13. Thus, movement characteristics of the debris flow at different angles can be simulated.

Dial 15 is provided between flow channel 6 and stacking groove 2 to measure the inclination angle of the flow channel. Angle indicating line 14 is provided on flow channel 6. Angle indicating line 14 is connected to dial 15 to indicate a scale. Dial 15 and angle indicating line 14 can accurately measure the inclination angle of the flow channel. Accordingly, the situation of the movement of the debris flow and the material accumulation can be recorded easily. Therefore, the experimental simulation condition can be determined precisely. Hence, a good fundamental condition can be established for the research of the movement characteristics of the debris flow.

Flow channel 6 is further provided with erosion groove 61 to simulate a debris flow erosion experiment. Fixing groove of cover plate 64 is provided in erosion groove 61. Cover plate of erosion groove 62 is installed in fixing groove of cover plate 64. When the erosion experiment is not required, erosion groove 61 is covered by cover plate of erosion groove 62, which flushes with the bottom plate of flow channel 6. Since erosion groove 61 and cover plate of erosion groove 62 are provided, the erosion experiment can be easily performed. Therefore, the amplification effect of the erosion of the debris flow can be researched.

The central axis of cover plate of the erosion groove 62 is further provided with three rows of reserved holes 66. One row of reserved holes 66 is provided on the central axis of cover plate of the erosion groove 62. Each reserved hole 66 is provided with a pressure sensor 65 to measure the dynamic pressure on the substrate during the movement of the debris flow. The provided pressure sensor 65 can monitor the dynamic pressure on the substrate during the flow of the debris flow. The magnitude of the punching force and shear force during the movement of the debris flow can be measured, such that the movement characteristics of the debris flow can be studied more accurately.

Screw hole of cover plate 63 is provided at each of the four corners of cover plate of the erosion groove 62. The internal diameter of the screw hole of cover plate 63 is 8 mm. When an erosion experiment is to be carried out, a cap bolt is crewed into screw hole of cover plate 63. The cover plate of erosion groove 62 is taken out. Then, erosion groove 61 is filled with the erosion material.

The experimental process of the present invention is as follows:

The debris flow experimental material is prepared in advance according to the experimental requirements. Then, baffle 7 is closed. Thereafter, the material is continuously poured into material box 5. When the height of the material reaches ¾ of the height of baffle plate 7, the pouring the material is stopped.

Next, the slopes of flow channel 6 and stacking groove 2 are adjusted according to the experimental requirements. Then, the widths of flow channel 6 and stacking groove 2 are adjusted. After that, the position and the angle of the first high-speed camera 3 are adjusted according to the experimental requirements. At the same time, the second high-speed camera 9 is adjusted to the upper portion of sliding rail 10 to be prepared for monitoring.

Next, fixing hole 21 in stacking groove 2 is used as the anchor hole. Next, the debris flow retaining wall is installed in fixing hole 21 according to the experimental requirements. Next, electric hydraulic lifting column 13 is adjusted, so that flow channel 6 reaches the pre-set angle. Cover plate of the erosion groove 62 is opened by the cap bolt. A loose particle layer is deposited in erosion groove 61 according to the experimental requirements. Two high-speed cameras are turned on. Finally, pulling rope 11 is pulled upwards at a constant speed. Also, the flow is controlled as the experiment required. Baffle 7 is opened, so that the material flows into flow channel 6. After a set of data is measured, the test residue is cleaned up with water. The positions of the two high-speed cameras are altered to prepare for the next test. The test is repeated as such until the required debris flow data are obtained. During the simulation experiment, in order to ensure the accuracy and safety of the experiment, stacking groove 2 and flow channel 6 are sealed with flexible continuous material.

With reasonable structure and procedure design, not only the movement characteristics of various debris flow in channels with different widths can be flexibly simulated by the present invention, but also the efficiency of the experiment is effectively improved. Therefore, compared with the prior art, the invention has prominent substantive characteristics and significant progress.

The above-described embodiments are merely one of the preferred embodiments of the present invention and should not be used to limit the scope of the invention. Any change or modification which is based on the main design concept and spirit of the present invention without substantial meanings, and solves the same problem as the present invention does, should all fall within the scope of the present invention.

What is claimed is:

1. An experimental device for debris flow simulation, comprising:
   a material supply device,
   a flow channel,
   a stacking groove,
   a pole,
   a first high-speed camera,
   a second high-speed camera,
   at least three fixing frames, and
   a sliding rail;
   wherein
   the material supply device is configured to store the debris flow simulation material and release the debris flow simulation material to the flow channel, so as to realize a start of the debris flow simulation;
   the flow channel is provided in a slant manner;
   the flow channel is configured to introduce debris flow simulation material towards a direction of the stacking groove;
   a position of a side surface of the flow channel is adjustable to change an overall width of the flow channel;
   one end of the stacking groove is connected to the flow channel for an accumulation of the debris flow;
   a plurality of fixing holes are provided inside the stacking groove;
   a protective structure of debris flow is mounted inside the fixing hole;
   the debris flow protective structure is configured to simulate an impact of the debris flow on the protective structure;
   a position of a side surface of the stacking groove is adjustable to change an overall width of the stacking groove;
   the pole is provided at an other end of the stacking groove;
   the pole is configured to support the stacking groove and adjust a slope of the stacking groove;
   the at least three fixing frames are arranged side-by-side right above the flow channel;
   the at least three fixing frames are configured to fix the first high-speed camera, so that the first high-speed camera is configured to monitor a movement of the debris flow at different positions and angles above the flow channel;
   the sliding rail is arranged beside the flow channel;
   the sliding rail is parallel to the flow channel;
   the second high-speed camera is provided on the sliding rail;
   the second high-speed camera is movable along the sliding rail; and
   the second high-speed camera is configured to monitor the movement of the debris flow in the flow channel from a side.

2. The experimental device for debris flow simulation according to claim 1, wherein the material supply device includes
   a material box, provided in a slant manner and connected to the flow channel to store the debris flow simulation material;
   a baffle, provided at a joint position of the material box and the flow channel; and
   a pulling rope, connected to the baffle to control an opening and closing of the baffle, so as to control whether the debris flow simulation material passes through the flow channel or not.

3. The experimental device for debris flow simulation according to claim 2, further comprising a support frame;
   wherein the material box is fixed to the support frame.

4. The experimental device for debris flow simulation according to claim 3, further comprising
   a fixed base, provided in the support frame, and
   a hydraulic lifting column, configured to adjust the inclination angle of the flow channel;
   wherein one end of the hydraulic lifting column is connected to the fixed base, and an other end of the hydraulic lifting column is connected to the flow channel.

5. The experimental device for debris flow simulation according to claim 4, further comprising
   a dial, provided between the flow channel and the stacking groove, the dial being configured to measure an inclination angle of the flow channel, and an angle indicating line, provided on the flow channel and connected to the dial, the angle indicating line being configured to indicate a scale.

6. The experimental device for debris flow simulation according to claim 1, wherein the flow channel further includes
an erosion groove configured to simulate a debris flow erosion experiment, and
a cover plate of the erosion groove;
wherein
the cover plate of the erosion groove flushes with a bottom of the flow channel;
the cover plate of the erosion groove covers the erosion groove through a fixing groove of the cover plate;
the fixing groove of the cover plate is provided in the erosion groove;
the cover plate of the erosion groove is further provided with a plurality of reserved holes;
each reserved hole is provided with a pressure sensor; and
the pressure sensor is configured to measure a dynamic pressure on a substrate during the movement of the debris flow.

7. The experimental device for debris flow simulation according to claim 6, wherein
an upper portion of the cover plate of erosion groove is provided with three rows of reserved holes; and
a middle row of the reserved holes is provided on a central axis of the cover plate of erosion groove.

8. The experimental device for debris flow simulation according to claim 7, further comprising
at least one screw hole of the cover plate;
wherein the screw hole of the cover plate is provided at corners of the cover plate of the erosion groove.

9. The experimental device for debris flow simulation according to claim 8, further comprising
four screw holes of the cover plate;
wherein the screw holes of the cover plate are provided at four corners of the cover plate of the erosion groove.

10. The experimental device for debris flow simulation according to claim 6, wherein the stacking groove and the flow channel are sealed with a flexible continuous material.

11. The experimental device for debris flow simulation according to claim 2, wherein the flow channel further includes
an erosion groove, configured to simulate a debris flow erosion experiment, and
a cover plate of the erosion groove;
wherein
the cover plate of the erosion groove flushes with a bottom of the flow channel;
the cover plate of the erosion groove covers the erosion groove through a fixing groove of the cover plate;
the fixing groove of the cover plate is provided in the erosion groove;
the cover plate of the erosion groove is further provided with a plurality of reserved holes;
each reserved hole is provided with a pressure sensor; and
the pressure sensor is configured to measure a dynamic pressure on a substrate during the movement of the debris flow.

12. The experimental device for debris flow simulation according to claim 3, wherein the flow channel further includes
an erosion groove, configured to simulate a debris flow erosion experiment, and
a cover plate of the erosion groove;
wherein
the cover plate of the erosion groove flushes with a bottom of the flow channel;
the cover plate of the erosion groove covers the erosion groove through a fixing groove of the cover plate;
the fixing groove of the cover plate is provided in the erosion groove;
the cover plate of the erosion groove is further provided with a plurality of reserved holes;
each reserved hole is provided with a pressure sensor; and
the pressure sensor is configured to measure a dynamic pressure on a substrate during the movement of the debris flow.

13. The experimental device for debris flow simulation according to claim 4, wherein the flow channel further includes
an erosion groove, configured to simulate a debris flow erosion experiment, and
a cover plate of the erosion groove;
wherein
the cover plate of the erosion groove flushes with a bottom of the flow channel;
the cover plate of the erosion groove covers the erosion groove through a fixing groove of the cover plate;
the fixing groove of the cover plate is provided in the erosion groove;
the cover plate of the erosion groove is further provided with a plurality of reserved holes;
each reserved hole is provided with a pressure sensor; and
the pressure sensor is configured to measure a dynamic pressure on a substrate during the movement of the debris flow.

14. The experimental device for debris flow simulation according to claim 5, wherein the flow channel further includes
an erosion groove, configured to simulate a debris flow erosion experiment, and
a cover plate of the erosion groove;
wherein
the cover plate of the erosion groove flushes with a bottom of the flow channel;
the cover plate of the erosion groove covers the erosion groove through a fixing groove of the cover plate;
the fixing groove of the cover plate is provided in the erosion groove;
the cover plate of the erosion groove is further provided with a plurality of reserved holes;
each reserved hole is provided with a pressure sensor; and
the pressure sensor is configured to measure a dynamic pressure on a substrate during the movement of the debris flow.

* * * * *